United States Patent
Saito (10) Patent No.: US 8,962,081 B2
(45) Date of Patent: Feb. 24, 2015

(54) TEMPLATE FORMING METHOD (75) Inventor: Masato Saito, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 847 days.

(21) Appl. No.: 13/051,883

(22) Filed: Mar. 18, 2011

(65) Prior Publication Data
US 2011/0318501 A1 Dec. 29, 2011

(30) Foreign Application Priority Data

Jun. 24, 2010 (JP) ................. 2010-144144

(51) Int. Cl.
G03F 7/00 (2006.01)
B82Y 10/00 (2011.01)
B82Y 40/00 (2011.01)

(52) U.S. Cl.
CPC ............ *G03F 7/0002* (2013.01); *B82Y 10/00* (2013.01); *B82Y 40/00* (2013.01)
USPC ........................................... 427/271; 216/44

(58) Field of Classification Search
CPC ................................................. G03F 7/0002
USPC ............................................ 216/44; 427/271
See application file for complete search history.

(56) References Cited

U.S. PATENT DOCUMENTS 8,128,830 B2 * 3/2012 Lille et al. .................. 216/40
2004/0065976 A1 * 4/2004 Sreenivasan et al. ...... 264/171.1

FOREIGN PATENT DOCUMENTS

| JP | 2005-108975 | | 4/2005 |
| JP | 2006-165371 | | 6/2006 |
| JP | 2006165371 A | * | 6/2006 |

* cited by examiner

*Primary Examiner* — Alex A Rolland
(74) *Attorney, Agent, or Firm* — Finnegan, Henderson, Farabow, Garrett & Dunner, LLP (57) ABSTRACT According to one embodiment, there is provided a template forming method that transfers a pattern from a first template to a to-be-processed substrate and subjects the to-be-processed substrate to a processing process to form a second template by using an imprinting method, includes forming a first resist film on a pattern forming region on the to-be-processed substrate, selectively forming a second resist film on a mark forming region on the to-be-processed substrate, transferring a concavo-convex pattern formed on the first template to the first resist film, and processing the to-be-processed substrate with the first resist film to which the concavo-convex pattern is transferred and the second resist film used as a mask.

11 Claims, 10 Drawing Sheets

TEMPLATE FORMING METHOD

CROSS-REFERENCE TO RELATED APPLICATIONS

This application is based upon and claims the benefit of priority from Japanese Patent Application No. 2010-144144, filed Jun. 24, 2010; the entire contents of which are incorporated herein by reference.

FIELD

Embodiments described herein relate generally to a template forming method.

BACKGROUND

Recently, as a pattern transfer technique for realizing a miniaturization process of a semiconductor integrated circuit, an optical imprinting method (SFIL: Step and Flash Imprint Lithography) attracts attention. In the optical imprinting method, a process for preparing a plurality of templates with the same shape, changing the templates according to the specified frequency of use of each template or the degree of occurrence of transfer defects and using the template is generally used.

However, in the template forming method using electron beam lithography, it is necessary to take an extremely long drawing time to form one template. Therefore, a plurality of templates with the same shape are prepared by use of a method for forming a parent template by using the electron beam lithography and then forming a plurality of child templates based on the parent template by an imprinting method. Further, a method for forming a pattern on a substrate by use of the child template is generally used.

When a manufacturing method for forming patterns by use of an optical imprinting method is considered, it is desirable to attach an inherent mark that can be used to identify the individual template to each template in order to manage the type and history of the template used. However, the child template formed by use of the optical imprinting method is an exact copy of the parent template except that a concavo-convex portion is inverted. Therefore, it is impossible to attach different IDs to respective templates at the pattern processing time.

DETAILED DESCRIPTION

In general, according to one embodiment, there is provided a template forming method that transfers a pattern from a first template to a to-be-processed substrate and subjects the to-be-processed substrate to a processing process to form a second template by using an imprinting method, comprising forming a first resist film on a pattern forming region on the to-be-processed substrate, selectively forming a second resist film on a mark forming region on the to-be-processed substrate, transferring a concavo-convex pattern formed on the first template to the first resist film, and processing the to-be-processed substrate with the first resist film to which the concavo-convex pattern is transferred and the second resist film used as a mask.

Before explaining the embodiment, the basic concept of the optical imprinting method is explained.

Figure 1A:
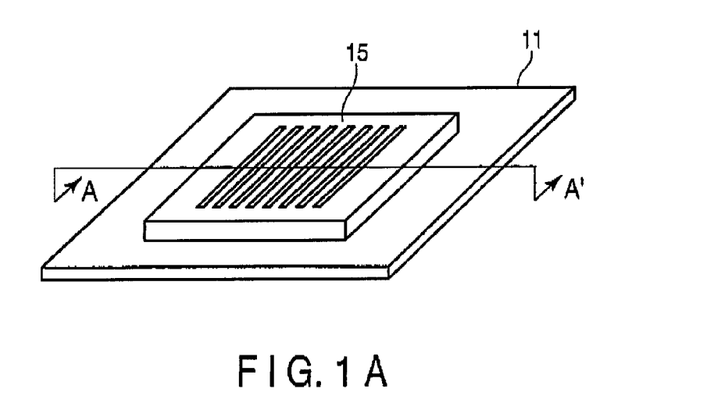
FIGS. 1A and 1B are a perspective view and cross-sectional view showing the schematic configuration of a template used in an optical imprinting method.
Figure 1B:
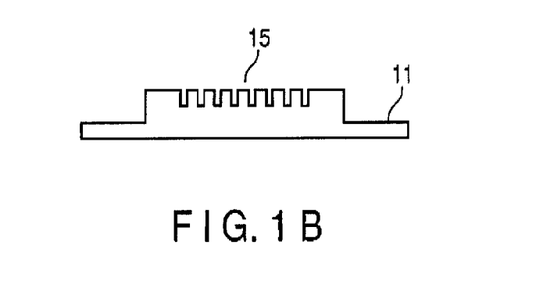

In the optical imprinting method, it is necessary to previously prepare a template used as a model to form a desired pattern as shown in FIGS. 1A, 1B. FIG. 1A is a perspective view showing the configuration of the template and FIG. 1B is a cross-sectional view taken along line A-A' of FIG. 1A. The template is obtained by forming a desired pattern 15 in a concavo-convex shape on the surface of a substrate 11 that is formed of a material such as quartz with high transparency.

Figure 2A:
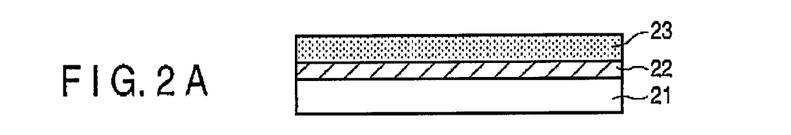
FIGS. 2A, 2B, 2C, 2D and 2E are cross-sectional views showing pattern transfer steps in the optical imprinting method.
Figure 2B:
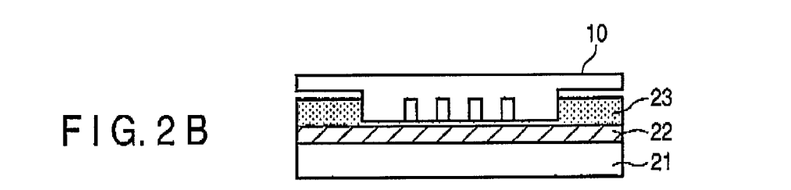
Figure 2C:
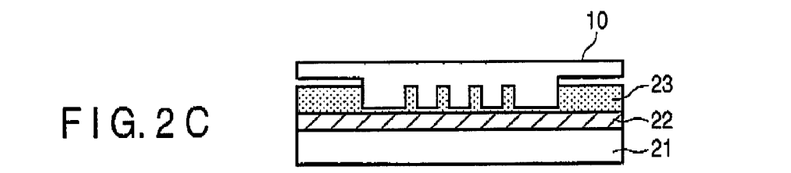

FIGS. 2A to 2E show one example of a pattern forming process in the optical imprinting method. First, as shown in FIG. 2A, a Cr thin film 22 is formed on a substrate 21 formed of quartz or the like to be subjected to a patterning process and a photo-curable resin 23 is coated thereon. Then, as shown in FIG. 2B, a template 10 previously prepared is pressed against the photo-curable resin 23. In this state, as shown in FIG. 2C, the structure is left as it is until the photo-curable resin 23 is filled into the concave portions of the template 10 by capillarity.

Figure 2D:
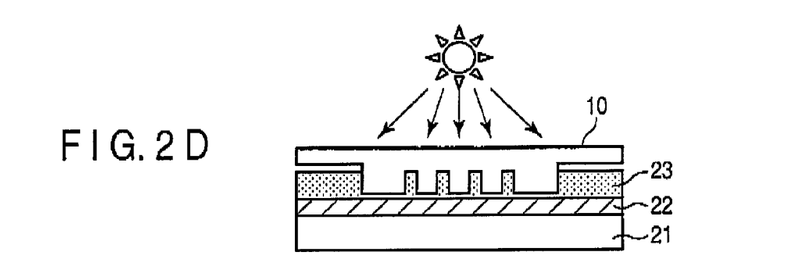
Figure 2E:
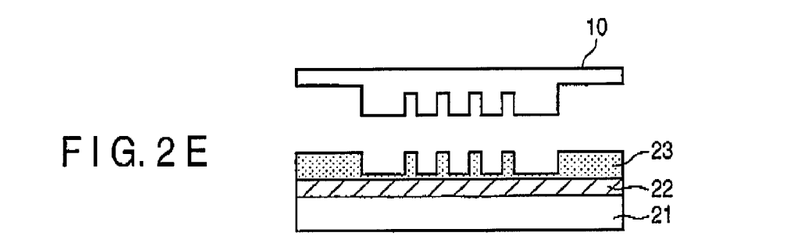

Next, as shown in FIG. 2D, light is illuminated onto the back surface of the template 10 to cure the photo-curable resin 23. Finally, as shown in FIG. 2E, a pattern of the resin 23 having the concavo-convex inverted shape with respect to the shape of the pattern formed on the template 10 is formed of the cured resin 23 by separating the template 10 from the substrate 21.

A pattern can be formed on the substrate 21 by performing a processing process such as an etching process with the pattern of the resin 23 used as a mask. That is, a pattern with a shape obtained by inverting the concavo-convex shape of the template 10 is formed on the substrate 21 by selectively etching the Cr thin film 22 with the pattern of the resin 23 used as a mask and then selectively etching the substrate 21 with the pattern of the Cr thin film 22 used as a mask.

As the imprinting method, several methods such as a method for using thermosetting resin instead of the photo-curable resin and forming a pattern by heating are proposed. In each of the above methods, a desired pattern is formed by transferring a pattern formed on the template onto the substrate. Thus, the technique for forming a template is important in the imprinting method.

FIGS. 3A to 3F show an example of a flow of forming a template used in the optical imprinting method by use of electron beam lithography.

Figure 3A:
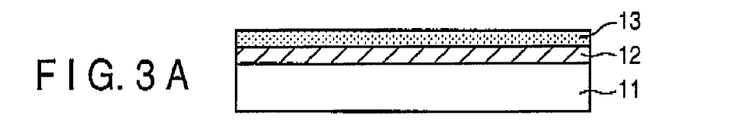
FIGS. 3A, 3B, 3C, 3D, 3E and 3F are cross-sectional views showing parent template forming steps used in the optical imprinting method.

First, as shown in FIG. 3A, a template substrate 11 used to form a template is prepared. A Cr thin film 12 is formed on the surface of the template substrate 11 and electron beam sensitive resist 31 is coated on the surface thereof.

As a member of the template substrate 11, synthetic quartz is generally used. This is because the member must be transparent with respect to illumination light to cure the resin by illuminating light onto the back surface of the pattern in the photo-curable resin curing step.

Figure 3B:
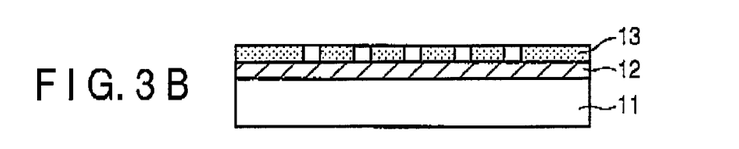
Figure 3C:
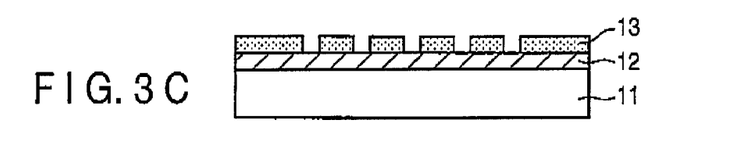

Then, as shown in FIG. 3B, a desired pattern is drawn on the prepared template substrate 11 by means of an electron beam exposure apparatus to selectively expose the resist 13 on the template substrate surface layer. The resin 13 of an electron beam exposure portion is removed by subjecting the pattern-drawn template substrate 11 to a development process as shown in FIG. 3C.

Figures 3D, 3E:
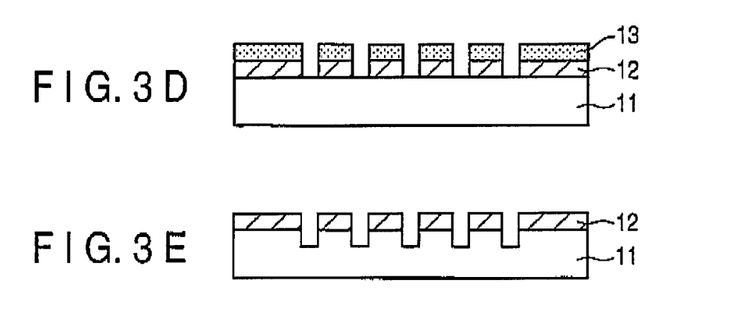

Next, as shown in FIG. 3D, the Cr thin film 12 is etched with the resist 13 used as a mask. After this, the remaining resist 13 is subjected to a separation process and eliminated.

Figure 3F:
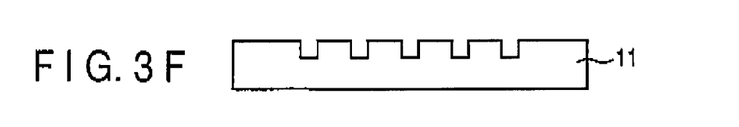

Subsequently, as shown in FIG. 3E, the substrate 11 is dug to a desired depth by an etching process with the pattern-processed Cr thin film 12 used as a mask. Finally, as shown in FIG. 3F, the Cr thin film 12 on the surface is eliminated. As a result, a template 10 having a desired pattern formed with a concavo-convex shape on the template substrate 11 is formed.

A pattern forming procedure by the optical imprinting method described before is used by utilizing the template 10 formed by the above procedure. Thus, a pattern whose shape is inverted with respect to the concavo-convex shape of the pattern formed on the template is transferred onto a desired substrate 21 by means of the solidified photo-curable resin 23. After this, a desired pattern can be formed on the substrate 21 by subjecting the substrate 21 to a process such as an etching process while the pattern of the photo-curable resin 23 formed on the substrate 21 is used as a mask.

As is described in the pattern forming procedure in the optical imprinting method, the pattern is formed by physically making the template contact with photo-curable resin or the like in the imprinting method. Therefore, there occurs a possibility that exact pattern transfer cannot be performed because the template 10 may be broken due to abrasion accompanied by frequent use, clogging in the concave portions of the pattern on the template and sticking of a hard foreign matter between the substrate and the template at the imprinting time. For this reason, it is common practice to use a process of preparing a plurality of templates with the same shape and using each template a specified number of times or switching and using a template according to the degree of occurrence of transfer defects.

However, in the template forming method using the electron beam lithography described in the template forming procedure, an extremely long drawing time is required for pattern drawing by use of electron beams. For example, if a pattern obtained by setting line-and-space patterns with a half pitch of 20 nm is drawn in a region of 65 nm×65 nm by means of a Gaussian beam drawing apparatus of acceleration voltage 100 keV now widely used, it is required to take a drawing time of almost one month. After a template is formed by electron beam lithography, a plurality of templates with the same shape are prepared by use of a method for forming a plurality of child templates by an imprinting method with the above template used as a parent template or further forming a plurality of grandchild templates based on the child template. As a method for forming a template on the substrate, a method using a child template or grandchild template is generally used.

When a manufacturing process for forming a pattern by use of an imprinting method is considered, it is desirable to attach an inherent mark usable to individually identify the template to each template in order to manage the type and history of the template used in the manufacturing process. Therefore, it is necessary to engrave an ID such as an inherent mark or inherent character string used for identification on the template.

However, the child template or grandchild template formed by use of the imprinting method is an exact copy of the parent template except that a concavo-convex portion is inverted. Therefore, it is impossible to attach different IDs to respective templates at the pattern processing time. It is possible to identify the template by use of an indirect procedure, for example, by attaching an identifiable name to a case used for storage of a template. However, for example, when a large number of patterns of various types are used as in a semiconductor device manufacturing process, there occurs a strong possibility that a risk of mistakenly taking a template is involved.

Therefore, a method for engraving an ID by additionally processing a template after forming the template is proposed. However, with this method, there occurs a problem that a step for ID formation is additionally provided and a time required for forming a template is increased. Further, there occurs a problem that the possibility of attaching dusts occurring at the additional processing time on a pattern or a risk of damaging the pattern on the template by the additional processing operation itself occurs.

Next, embodiments that solve the above problem and form a second template (child template) with an identification mark based on a first template (parent template) are explained.

First Embodiment

In a first embodiment, a method for forming an identifiable mark on a second template when the second template is formed based on a first template by use of an optical imprinting method is shown. The existing technique is used as a method for forming the first template and the detailed explanation thereof is omitted in this embodiment. Further, the existing technique is used as a process such as an etching process after a pattern is formed of photo-curable resin on the to-be-processed substrate and the detailed explanation thereof is omitted in this embodiment.

Figure 4:
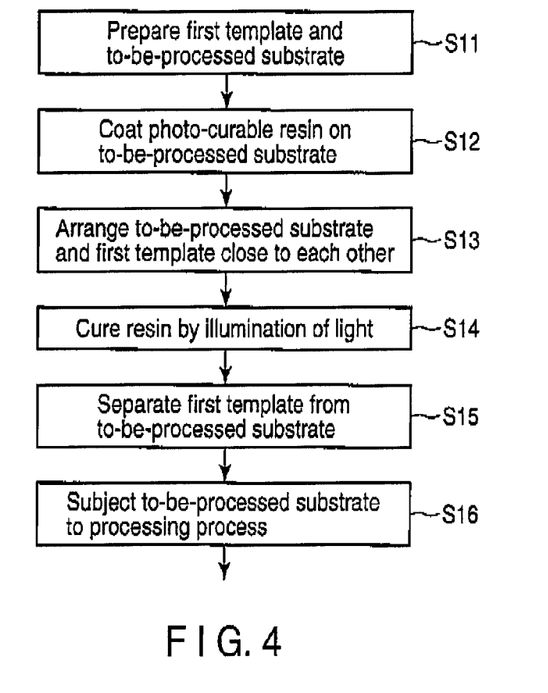
FIG. 4 is a flowchart for illustrating a template forming method according to a first embodiment.

FIG. 4 shows a second template forming flow used in the first embodiment. Next, the content of the first embodiment is explained below with reference to the flow of FIG. 4.

In the first step (S11), a first template having a desired pattern formed thereon and a to-be-processed substrate used to process a second template are prepared.

Figure 5:
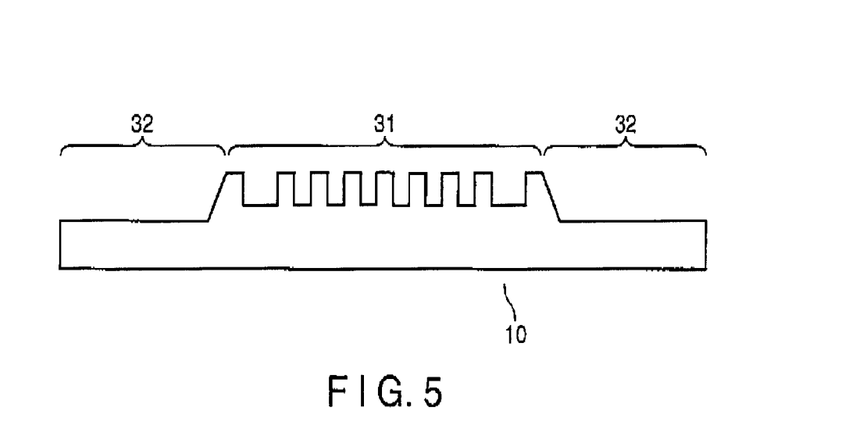
FIG. 5 is a cross-sectional view showing the schematic configuration of a template according to the first embodiment.

FIG. 5 shows the cross-sectional structure of a first template 10. Generally, the structure (mesa structure) in which the surface heights of a pattern region 31 on which a pattern formed of a concavo-convex portion and desired to be transferred exists and a peripheral region 32 on which no pattern exists are different is provided. This is to prevent the peripheral portion of the pattern region of the first template 10 from being brought into contact with a pattern previously formed on the periphery of a pattern-transferring region on the to-be-processed substrate 21 side when the first template 10 is set close to the to-be-processed substrate 21 to transfer the pattern. Further, the outermost concave portion of the pattern region 31 is a stopper portion that prevents resin from overflowing to the outside portion of the pattern region 31.

The mesa structure may be formed on either the first template side or the to-be-processed substrate side. Further, the structures may be formed on both of the first template side and to-be-processed substrate side. In this embodiment, it is assumed that the first template has the mesa structure and no mesa structure is provided on the to-be-processed substrate side.

In the second step (S12), the to-be-processed substrate is arranged with the to-be-processed surface thereof set up and photo-curable resin is coated on the to-be-processed surface. At this time, in a general method, photo-curable resin is coated only on a desired portion of the to-be-processed surface onto which pattern transfer is desired. Therefore, an ink jet type coating apparatus capable of controlling the coating position is generally used as a resin coating apparatus.

Figure 6:
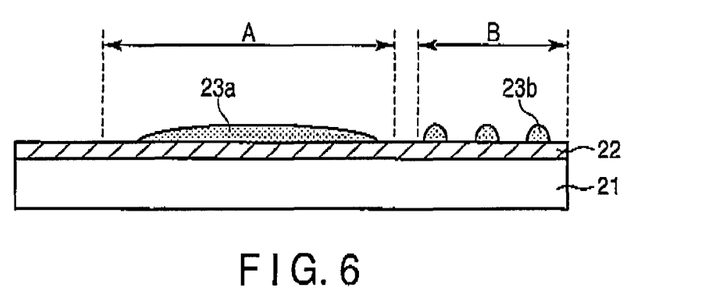
FIG. 6 is a cross-sectional view showing a state in which resin is coated on a to-be-processed substrate, for illustrating the process of the first embodiment.

FIG. 6 shows a state in which photo-curable resin 23 is coated on the to-be-processed substrate 21. Region A in FIG. 6 is a pattern-forming region on the to-be-processed substrate 21 onto which a pattern formed on the first template 10 is to be transferred. For example, coating of photo-curable resin (first resist) 23a into region A is performed while a coating amount is changed according to the shape of the pattern on the first template 10 to be transferred and the coating amount is not always kept constant. Region B in FIG. 6 is a mark-forming region on the to-be-processed substrate 21 on which an individually identifiable mark is formed. The present embodiment has a feature that photo-curable resin (second resist) 23b is selectively coated to permit an individual identification mark to be formed in region B.

The photo-curable resins 23a, 23b may be formed of the same material or different materials. That is, the photo-curable resin 23a and photo-curable resin 23b may be coated by means of one coating apparatus or the photo-curable resin 23a and photo-curable resin 23b may be coated by means of different coating apparatuses.

Figure 7:
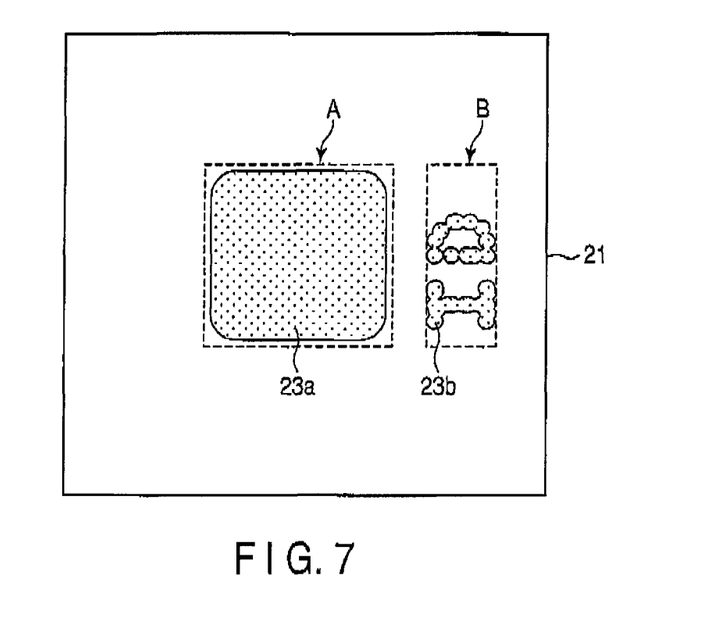
FIG. 7 is a plan view showing the state in which resin is coated on the to-be-processed substrate, for illustrating the process of the first embodiment.

FIG. 7 shows a state in which the photo-curable resin 23b is coated on mark-forming region B of FIG. 6 according to the process of this embodiment as viewed from the upper surface of the to-be-processed substrate 21. In this embodiment, a character string is used as an individual identification mark, but something such as a 2D barcode other than the character string may be used.

In the third step (S13), the first template 10 is set close to the upper surface of the to-be-processed substrate 21 on which a photo-curable resin is coated and the structure is kept held until the photo-curable resin 23a coated on the to-be-processed substrate 21 penetrates into a pattern with the concavo-convex shape formed on the first template 10.

Figure 8:
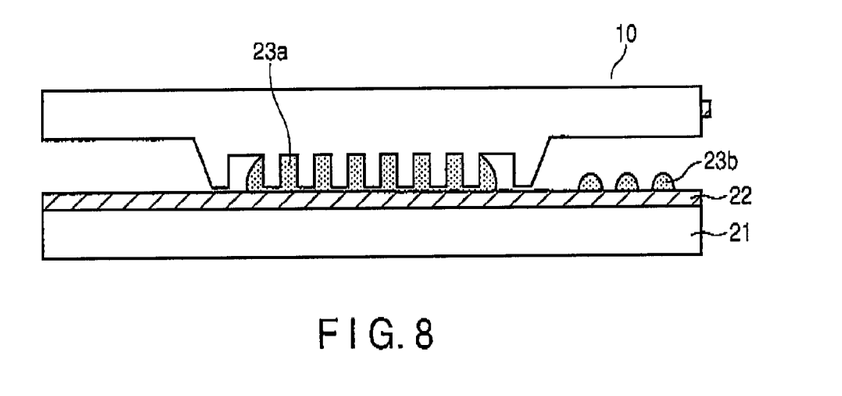
FIG. 8 is a cross-sectional view showing a state in which resin has penetrated into the concave portions of a first template, for illustrating the process of the first embodiment.

FIG. 8 shows a state in which the resin 23 has penetrated. The resin 23a penetrates into the concave portions of the template 10 in pattern-forming region A and the resin 23b is kept unchanged in mark-forming region B. In this embodiment, a region in which the individual identification mark is formed is set in a region corresponding to the concave portions of the mesa structure in the first template 10. However, the region may correspond to the convex portions of the mesa structure.

In the fourth step (S14), light is applied to the photo-curable resin 23 to cure the resin 23. In the fifth step (S15), the first template 10 is separated from the to-be-processed substrate 21.

Figure 9:
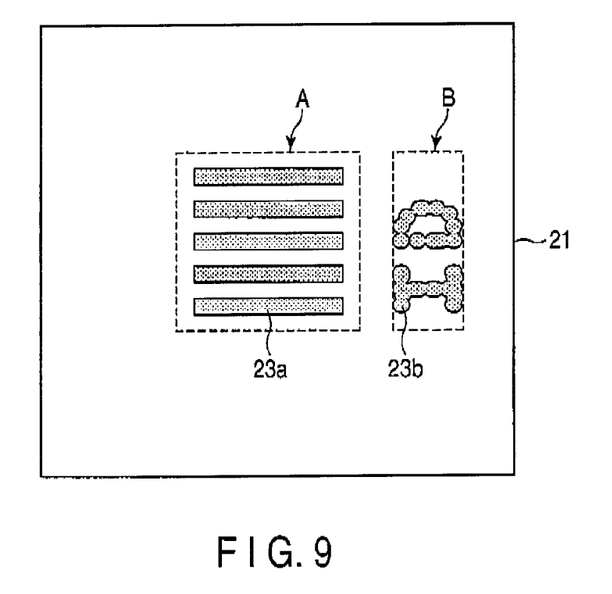
FIG. 9 is a plan view showing a state of a to-be-processed substrate after separation of the template, for illustrating the process of the first embodiment.

FIG. 9 is a view when viewing the to-be-processed substrate 21 after completion of the above process from above. In pattern-forming region A, the resin 23a in a portion corresponding to the concave portions of the first template 10 is formed as convex portions. In individual identification mark-forming region B, an individual identification mark is formed in a convex form by curing the resin 23 with the shape obtained at the coating time.

In the sixth step (S16), a process such as an etching process is performed while the pattern formed of the resin 23 formed up to the fifth step is used as a mask pattern. As a result, a second template having an individual identification mark is finally completed.

As described above, according to this embodiment, a child template having an individual identification mark can be easily formed based on a parent template by the imprinting method. In this case, the step additionally provided for forming an individual identification mark is only to selectively coat the resin 23b on the mark-forming region in the second step. Therefore, a problem of increasing the time required for forming a template is not provided. Further, unlike the method for engraving the ID by an additional process, occurrence of dusts or attachment of dusts will not occur and a risk of damaging the pattern on the template by the operation itself of the additional process does not occur.

Further, in this embodiment, only one imprinting process is performed for one to-be-processed substrate. However, this embodiment is not limited to this case and a process of the second step to the fifth step may be performed plural times for one to-be-processed substrate to form a plurality of second templates having different individual identification marks on the same to-be-processed substrate. Further, if a different first template is used in each cycle when the above process is performed plural times, a plurality of second templates of different types having different individual identification marks can be formed on the same to-be-processed substrate.

Second Embodiment

In a second embodiment, a method for forming an individually identifiable mark on a second template after a pattern is transferred from a first template to a to-be-processed substrate by using the optical imprinting method is shown.

Figure 10:
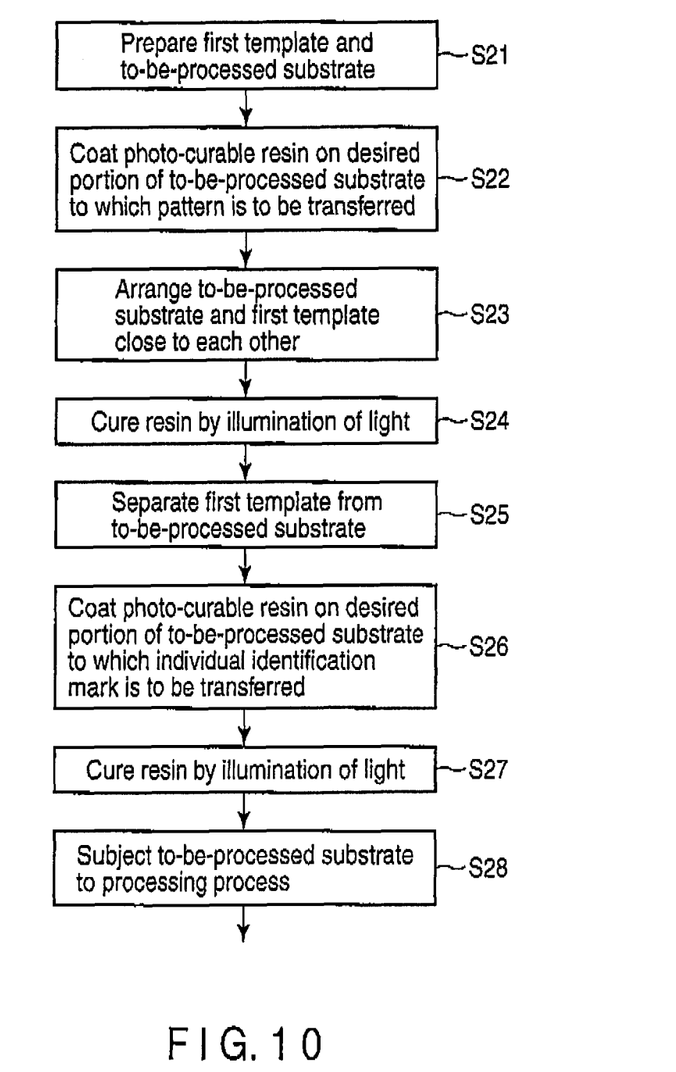
FIG. 10 is a flowchart for illustrating a template forming method according to a second embodiment.

FIG. 10 shows a flow for forming a second template used in the second embodiment. The content of the second embodiment is explained with reference to the flow shown in FIG. 10.

In the first step (S21), a first template and a to-be-processed substrate used for forming a second template are prepared.

In the second step (S22), the to-be-processed substrate is arranged with the to-be-processed surface thereof set up and photo-curable resin is coated in a position in which a pattern of the to-be-processed surface is to be transferred.

In the third step (S23), the first template is set close to the upper surface of the to-be-processed substrate on which the photo-curable resin is coated and the structure is kept held until the resin coated on the to-be-processed substrate penetrates into a pattern with the concavo-convex shape formed on the first template.

In the fourth step (S24), light is applied to the photo-curable resin to cure the resin.

In the fifth step (S25), the first template is separated from the to-be-processed substrate.

Figure 11:
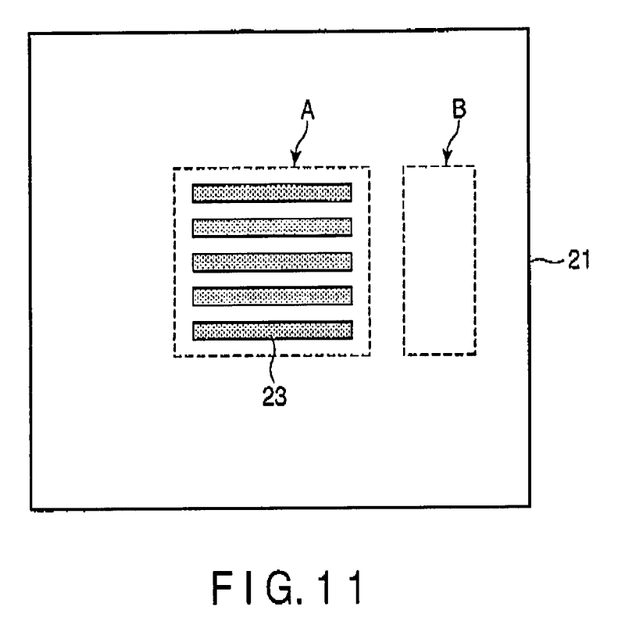
FIG. 11 is a plan view showing the state of a to-be-processed substrate in a fifth step of the second embodiment.

FIG. 11 shows the shape of the pattern formed on the to-be-processed substrate 21 up to the above step. The pattern of the resin 23 is transferred to region A, but no pattern is transferred to region B.

In the sixth step (S26), photo-curable resin is selectively coated to form an individual identification mark on a region other than the region on which the pattern on the to-be-processed substrate is formed.

In the seventh step (S27), light is applied to the photo-curable resin coated in the sixth step to cure the resin.

In the eighth step (S28), a process such as an etching process is performed while the pattern formed of the resin formed up to the seventh step is used as a mask pattern and a second template having an individual identification mark is finally completed.

Thus, in this embodiment, a child template having an individual identification mark can be easily formed based on a parent template by the imprinting method and the same effect as that of the first embodiment can be obtained. In this embodiment, the step of coating and curing the photo-curable resin is performed in two separate cycles, but the operation for processing the to-be-processed substrate with the resin pattern used as a mask is performed once and the number of processes is not substantially increased.

Further, in this embodiment, only one imprinting process is performed for one to-be-processed substrate. However, this embodiment is not limited to this case and a process of the second step to the fifth step may be performed plural times for the same to-be-processed substrate to form a mask pattern by resin of a plurality of second templates on the same to-be-processed substrate. Further, a process of the sixth step to the eighth step may be performed to form a plurality of second templates having different individual identification marks on the same to-be-processed substrate. Additionally, if a different first template is used in each cycle when the above process is performed plural times, a plurality of second templates of different types having different individual identification marks can be formed on the same to-be-processed substrate.

Third Embodiment

In a third embodiment, the same procedure as that of the first and second embodiments is performed by coating photo-curable resin 23 on a first template 10 with the first template 10 set on the lower side and a to-be-processed substrate 21 set on the upper side.

Figure 12:
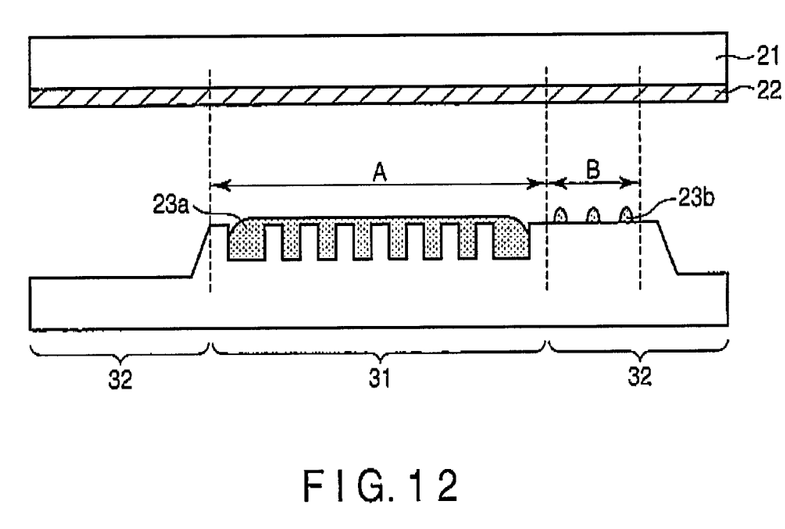
FIG. 12 is a cross-sectional view showing an example of a first template and to-be-processed substrate used in a third embodiment.

In this case, as shown in FIG. 12, it is necessary to form a region on which an individual identification mark is formed as convex portions of the mesa structure together with the first template 10 and to-be-processed substrate 21. In another respect, this embodiment is not greatly different from the first and second embodiments. However, since resin 23b coated on the first template 10 is to be attached to the to-be-processed substrate 21, a peripheral region 32 is formed with the same height as that of a pattern region 31.

Also, in this embodiment, a child template having an individual identification mark can be easily formed based on a parent template by the imprinting method and the same effect as that of the first embodiment can be obtained.

Fourth Embodiment

In a fourth embodiment, a part of or the entire portion of a concavo-convex pattern that can be used to form an individual identification mark formed on a first template is transferred to a to-be-processed substrate to form a second template having an individual, identification mark.

Figure 13:
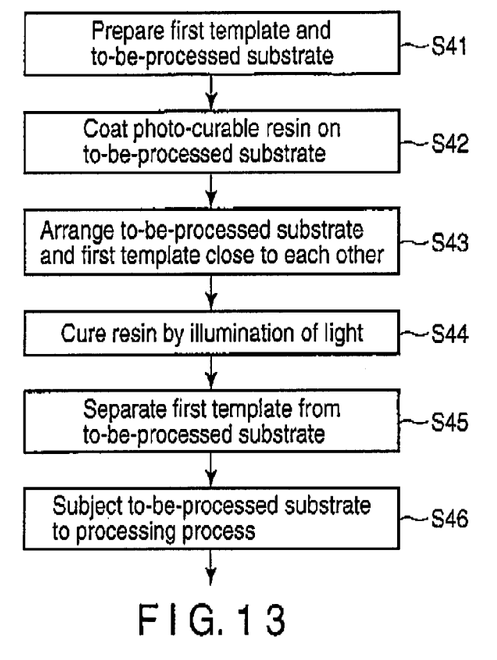
FIG. 13 is a flowchart for illustrating a template forming method according to a fourth embodiment.

FIG. 13 shows a flow for forming a second template used in the fourth embodiment. The content of the fourth embodiment is explained with reference to the flow of FIG. 13.

In the first step (S41), a first template and a to-be-processed substrate used to form a second template are prepared. A concavo-convex pattern that can be used to form an individual identification mark must be formed on the first template.

Figure 14:
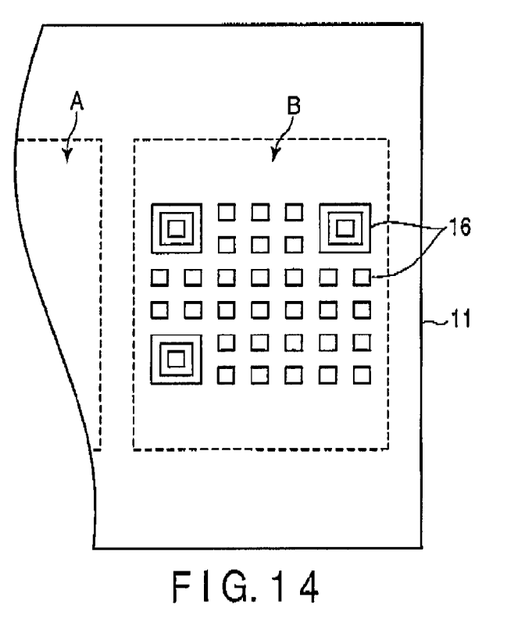
FIG. 14 is a plan view showing a pattern used for forming an individual identification mark formed on a first template, for illustrating the process of the fourth embodiment.

FIG. 14 shows an individual identification mark 16 formed on the first template used in this embodiment. In this embodiment, the structure is formed to form a 2D barcode on the to-be-processed substrate, but this embodiment is not limited to this structure.

In the second step (S42), the to-be-processed substrate is arranged with the to-be-processed surface thereof set up and photo-curable resin is coated on the to-be-processed surface. At this time, on a region onto which a pattern formed on the first template is to be transferred, resin is coated according to the shape of the pattern on the first template desired to be transferred according to the conventional technique. Further, on a region on which an individual identification mark is desired to be formed, resin is selectively coated to form an individual identification mark of a desired shape after transferring.

Figure 15:
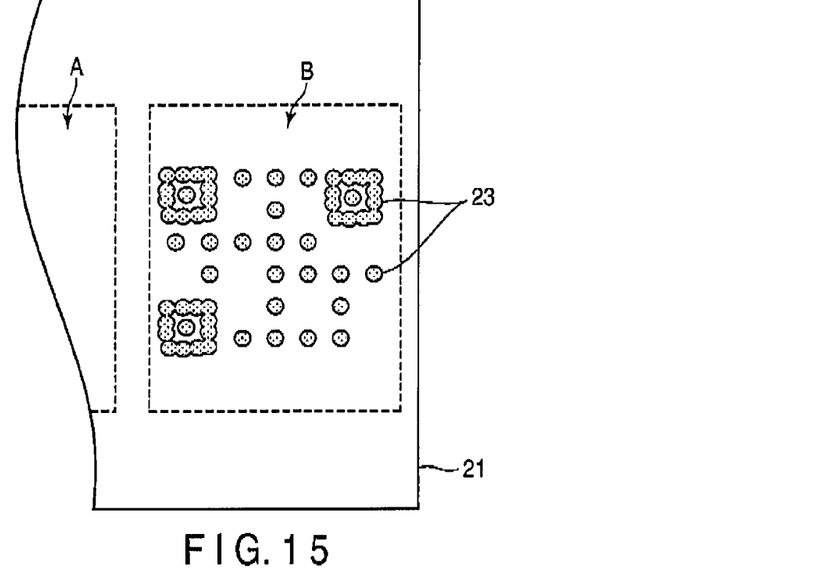
FIG. 15 is a view showing resin coated on a to-be-processed substrate, for illustrating the process of the fourth embodiment.

FIG. 15 shows a state in which photo-curable resin is coated in the second step. In identification mark forming region B, resin 23 is coated only on a required portion of a to-be-processed substrate 21 according to a pattern of an individual identification mark 16. It is unnecessary to precisely form the resin in the process of coating the resin 23 since the shape of the resin 23 is finally defined by transferring the pattern of the first template.

In the third to fifth steps (S43 to S45), a pattern is formed of resin cured on the to-be-processed substrate.

Figure 16:
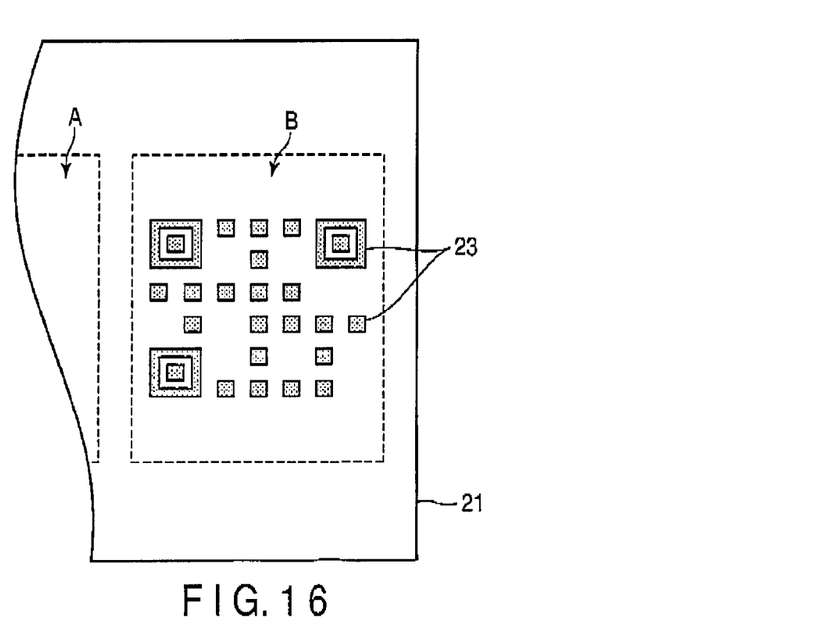
FIG. 16 is a view showing a resin pattern formed on the to-be-processed substrate after separation of the template, for illustrating the process of the fourth embodiment.

FIG. 16 shows a pattern formed of the cured resin 23 on the to-be-processed substrate 21 after the process up to the fifth step has been performed.

In the sixth step (S46), a process such as an etching process is performed while the pattern formed of the resin formed up to the fifth step is used as a mask pattern. As a result, a second template having an individual identification mark is finally completed.

In this embodiment, only one imprinting process is performed for one to-be-processed substrate. However, this embodiment is not limited to this case and a process of the second step to the fifth step may be performed plural times for one to-be-processed substrate to form a plurality of second templates having different individual identification marks on the same to-be-processed substrate. Further, if a different first template is used in each cycle when the above process is performed plural times, a plurality of second templates of different types having different individual identification marks can be formed on the same to-be-processed substrate.

(Modification)

This invention is not limited to the above embodiments. In the embodiments, quartz is used as the template substrate, but it is not necessarily limited to quartz and any material having sufficiently high transparency with respect to the wavelength of light used in the optical imprinting method can be used.

The identification mark is not limited to a given character string and may be a one-dimensional barcode mark or two-dimensional barcode mark or a combination of these marks. Further, the groove depth to which the substrate is dug to form the identification mark may be adequately determined according to the specification.

The process used in each embodiment does not restrict the content of this invention. In the embodiment, the electron beam drawing apparatus is used as lithography means used to form the pattern of the first template, but another apparatus such as a laser beam drawing apparatus or ion beam drawing apparatus can be used if the apparatus satisfies the required specification such as precision. In this case, the type of resist used may be changed depending on the drawing apparatus used. Further, the imprinting method for forming the second template is not limited to the optical imprinting method. For example, a thermal imprinting method using thermosetting resin instead of photo-curable resin can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template forming method that transfers a pattern from a first template to a substrate and subjects the substrate to a processing process to form a second template by using an imprinting method, comprising:
    forming a first resist film on a pattern forming region on the substrate,
    selectively forming a second resist film corresponding to an individual identification mark on a mark forming region on the substrate,
    transferring a concavo-convex pattern formed on the first template to the first resist film, the first template excluding a pattern corresponding to the individual identification mark, and
    processing the substrate with the first resist film to which the concavo-convex pattern is transferred and the second resist film corresponding to the individual identification mark used as a mask.

2. The method according to claim 1, wherein forming the first resisting film includes coating a first resist on a pattern forming region on the substrate that corresponds to a pattern region on which a concavo-convex pattern is formed on the first template, selectively forming the second resist film includes selectively coating a second resist to form a desired pattern on a mark forming region on the substrate that corresponds to a peripheral region on which a pattern on the first template is not formed, the first template is closely adhered to the substrate on which the first and second resists are coated to penetrate the first resist coated on the substrate into concave portions of the first template, the first and second resists are cured after the first resist is penetrated into the concave portions of the first template, and the first template is separated from the substrate and first resist after the first and second resists are cured for formation of the first resist film, formation of the second resist film and transfer of the concavo-convex pattern.

3. The method according to claim 2, wherein the first and second resists are formed of the same material.

4. The method according to claim 3, wherein the first and second resists are photo-curable resin.

5. The method according to claim 3, wherein the first and second resists are thermosetting resin.

6. The method according to claim 2, wherein concave portions are formed in a region of the first template corresponding to the pattern region.

7. The method according to claim 1, wherein the first resist is coated on a pattern forming region on the substrate that corresponds to a pattern region on which a concavo-convex pattern is formed on the first template, the first template is closely adhered to the substrate to penetrate the first resist coated on the substrate into concave portions of the first template, the first resist that is penetrated into the concave portions of the first template is cured, the first template is separated from the substrate and the first resist after the first resist is cured, the second resist is selectively coated in a desired pattern shape on a mark forming region on the substrate that corresponds to a region on which a pattern on the first template is not formed, and the second resist coated is cured for formation of the first resist film, formation of the second resist film and transfer of the concavo-convex pattern.

8. The method according to claim 7, wherein the first and second resists are formed of the same material.

9. The method according to claim 8, wherein the first and second resists are photo-curable resin.

10. The method according to claim 8, wherein the first and second resists are thermosetting resin.

11. The method according to claim 7, wherein concave portions are formed in a region of the first template corresponding to the pattern region.

* * * * *

UNITED STATES PATENT AND TRADEMARK OFFICE
CERTIFICATE OF CORRECTION

| | |
|---|---|
| PATENT NO. | : 8,962,081 B2 |
| APPLICATION NO. | : 13/051883 |
| DATED | : February 24, 2015 |
| INVENTOR(S) | : Saito |

It is certified that error appears in the above-identified patent and that said Letters Patent is hereby corrected as shown below:

In the Claims

Claim 2, column 9, line 51, change "first resisting film" to --first resist film--.

Signed and Sealed this
Twenty-eighth Day of July, 2015

Michelle K. Lee
*Director of the United States Patent and Trademark Office*